June 21, 1966 A. D. EVANS 3,257,631

SOLID-STATE SEMICONDUCTOR NETWORK

Filed May 2, 1960 4 Sheets-Sheet 1

INVENTOR.
Arthur D. Evans
BY
Stevens, Davis, Miller & Mosher
ATTORNEYS

SOLID-STATE SEMICONDUCTOR NETWORK

Filed May 2, 1960 4 Sheets-Sheet 2

INVENTOR.
Arthur D. Evans
BY
Stevens, Davis, Miller & Mosher
ATTORNEYS

INVENTOR.
Arthur D. Evans
BY
Stevens, Davis, Miller & Mosher
ATTORNEYS

INVENTOR

Arthur D. Evans

BY Stevens, Davis, Miller & Mosher

ATTORNEYS

United States Patent Office 3,257,631
Patented June 21, 1966

3,257,631
SOLID-STATE SEMICONDUCTOR NETWORK

Arthur D. Evans, Farmers Branch, Tex., assignor to Texas Instruments Incorporated, Dallas, Tex., a corporation of Delaware Filed May 2, 1960, Ser. No. 26,337
3 Claims. (Cl. 333—70)

The invention relates to integrated semiconductor networks and more particularly to such networks which feature active elements with high effective impedances.

Integrated semiconductor networks have heretofore been proposed, illustrative of which are those disclosed in an application by Jack S. Kilby, Serial No. 791,602, filed Feb. 6, 1959, now Patent No. 3,138,743, and entitled, "Miniaturized Electronic Circuits and Method of Making." According to that application, entire electronic networks are fabricated entirely within tiny wafers of semiconductor material, for various portions of the material act as discrete circuit elements, and other portions of the material act to connect internally certain of the circuit elements as required.

Although the subject matter of the Kilby application constitutes a major breakthrough in the art of circuit miniaturization, and although through its practice any of a wide variety of electronic networks can be formed within a single tiny wafer of semiconductor material, problems have arisen when the frequency characteristics of some of the networks have been lowered to include the audio range. Thus, for example, when it has been desired to form a complete low-frequency amplifier within a tiny wafer of semiconductor material, the input impedance levels of the amplifier has been sufficiently low so as to require the inclusion of relatively high-valved capacitors.

The problem that low input impedance presents in terms of a requirement for high values of capacitance will be appreciated when it is recognized that frequency response characteristics of an amplifier are in large meassure determined by the ratio of coupling and bypass capacitor reactances to the impedances presented at the electrodes of the amplifier active elements (e.g., transistors). Thus, since the input impedances of bipolar transistors are relatively low, the capacitive reactances required for the associated capacitors must be correspondingly low at the frequencies involved, and this, in turn, required that, in low-frequency embodiments, the values of the capacitors be relatively high.

It is generally recognized that one of the major factors influencing the capacitance presented by a capacitor relates to the effective areas of the capacitor plates. Thus, the value of capacitance available in a given design will vary directly as a function of the area thereof; and, though relatively large values of capacitance can be obtained by increasing the size of the semiconductor wafers proposed in the foregoing application, an inordinate increase in such size would tend to offset one of the major advantages thereof, namely, the extremely small size of the integrated network. Consequently, it has not been found practicable to exceed certain values of capacitance if the full advantage of small size is to be obtained.

Reference to copending application by Arthur D. Evans and Jack S. Kilby, filed on even date herewith, Serial No. 26,136, discloses the use of a unipolar device in conjunction with a low impedance bipolar device as an impedance matching element. Thus, the need for a large capacitance (necessarily large area capacitor) connected to the low impedance input of a bipolar device for audio frequency operation is eliminated by the use of the unipolar device as referred to in the above copending application.

Although the above referred to invention eliminates the necessity of a high value capacitance to the input of a low input impedance device for low frequency applications, the inclusion of a unipolar device for impedance matching purposes itself presents a problem. Since the semiconductor material parameters are temperature dependent, an adverse effect in the stability of operation of semiconductor circuits is seen unless some means is utilized to offset the parameter changes with temperature. In the specific circuits of the above-referred to Kilby and Evans copending application, this problem manifests itself by instability of the D.-C. bias voltages of the amplifier.

The present invention provides a measure whereby the bias voltages of the amplifier are stabilized by utilizing a unique feedback means from the output of an amplifier circuit to the input of the unipolar device. To accomplish this, two unipolar devices are incorporated in a manner to provide a novel low-pass filter means. The use of a pair of unipolar devices as the resistive elements of a low-pass filter eliminates the necessity of large and bulky resistors. The unipolar devices are biased in a fashion so that the channels thereof act as a high impedance current path. By so using the unipolar devices in a low-pass filter, such a filter is easily incorporated within an integrated semiconductor network.

Field-effect devices themselves are old in the art, and reference is made to Patent No. 2,744,970 granted to W. Shockley for an understanding thereof. As will be apparent from a reference to that patent, field-effect devices exhibit the characteristic of high-input impedance. However, although the proposals for field-effect devices have held great promise, many problems have been encountered in production, and consequently they have never found significant commercial success.

Recent improvements have overcome many difficulties previously encountered. Thus, structures have been disclosed which offer significant advantages that greatly lessen manufacturing problems. However, there has been no proposal for the integration of a field-effect device into a semiconductor electronic network.

It is one general object of this invention to impart greater versatility to semiconductor networks.

It is still another object of this invention to extend the frequency range over which networks of minimum size can be effectively operated.

It is still another object of this invention to raise greatly the effective input impedance of active elements within integrated electronic networks.

It is still a further object of this invention to optimize the ratios between impedances present at active element electrodes and the reactances presented by associated capacitors.

Consequently, and in accordance with one feature of the invention, a field-effect transistor is advantageously integrated into a solid semiconductor network and is arranged as an input element whereby an extremely high-input impedance is effectively obtained.

In accordance with another feature of the invention, integration of the field-effect device is accomplished in such a manner that interconnection of the field-effect device with related passive elements is accomplished entirely within a single semiconductor wafer.

In accordance with still a further feature of the invention, in one particular embodiment, a field-effect device and a bipolar transistor device are both cooperatively integrated within a single semiconductor wafer in such manner that interconnections therebetween are advantageously made within the wafer and with optimum impedance relationships. Thus, not only are both elements entirely formed within a semiconductor wafer, but their formation is so coordinated as to optimize their operative interrelationships.

In accordance with yet another feature of the invention, parts of several elements, including the field-effect device, are formed simultaneously by the advantageous multiple effect of selected steps.

In accordance with yet a further feature of the invention, in one embodiment, an entire two-stage amplifier is integrated into a wafer of material, and a field-effect structure is arranged in cooperative relationship with an associated capacitor. Thus, a virtual low-pass filter is formed, and is connected to provide a D.-C. feedback path to stabilize amplifier bias.

These and other objects and features of the invention will be apparent from the following detailed description, by way of example, with reference to the drawing in which.

Figure 4A:
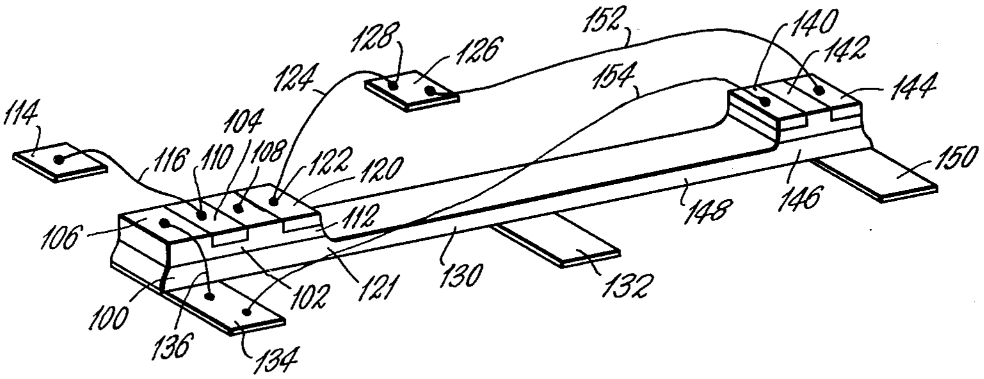
Figure 4B:
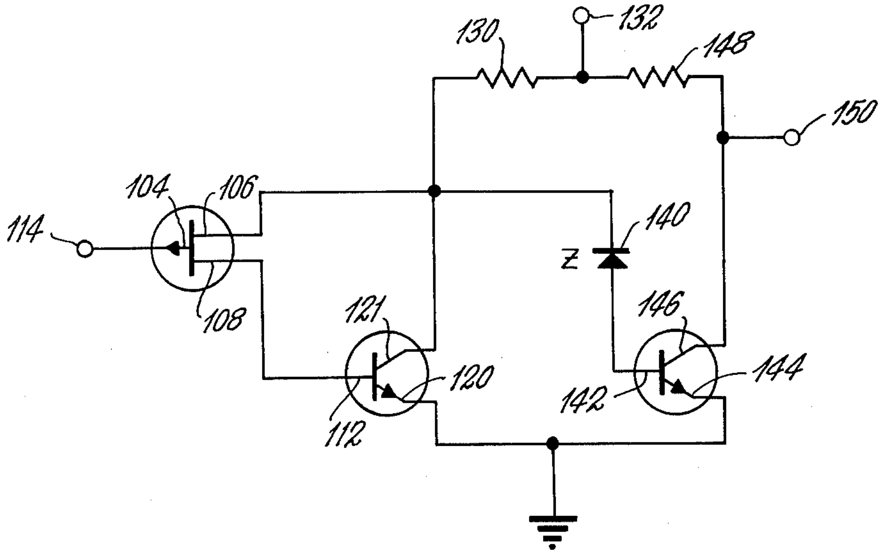
Figure 4C:
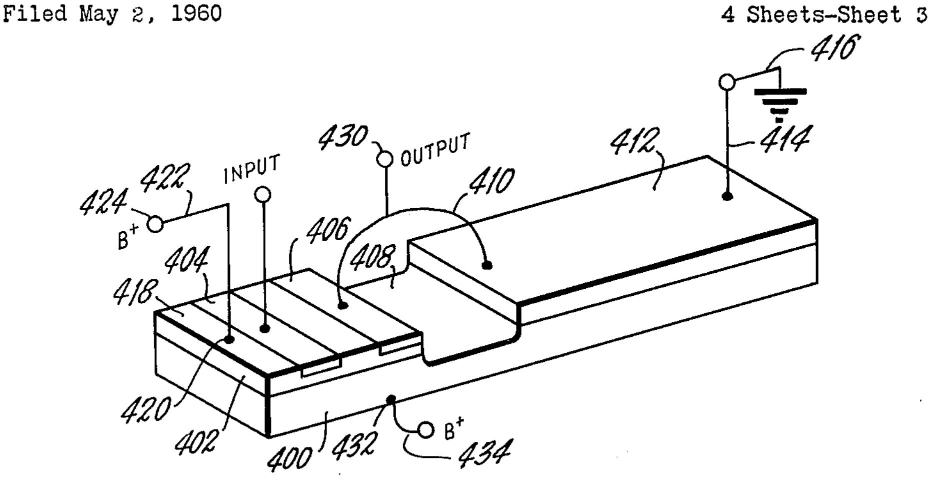
Figure 4D:
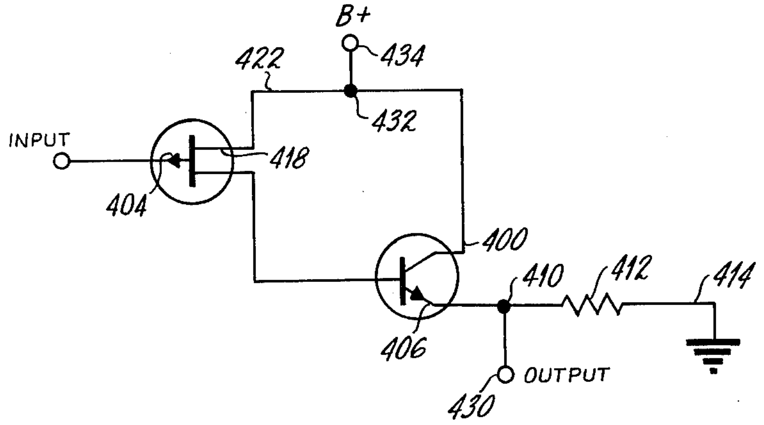
Figure 5A:
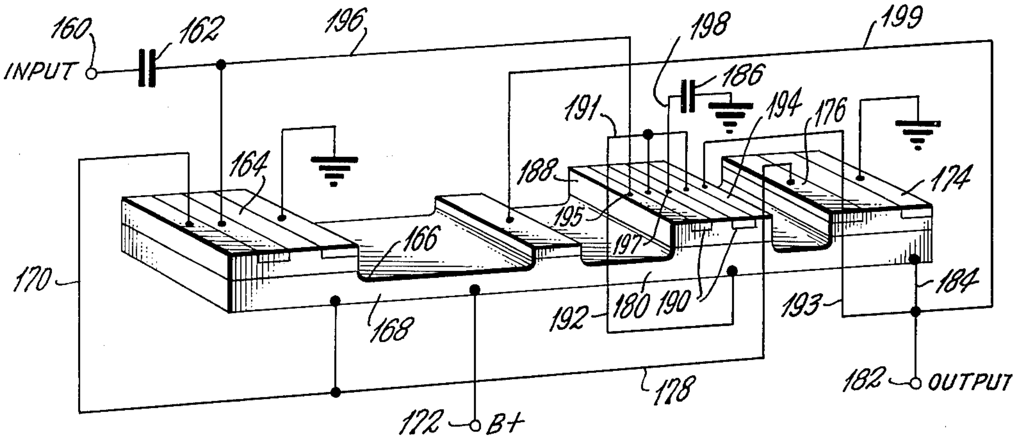
Figure 5B:
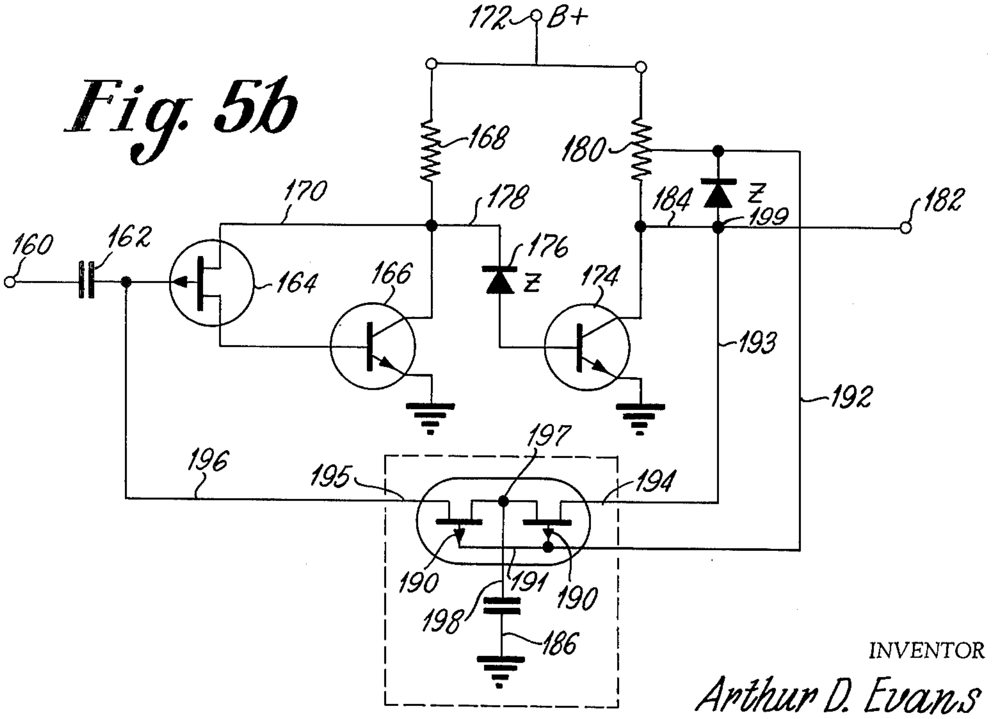

FIGURE 4*a* is a perspective view of a novel semiconductor network embodying the principles of the invention;

FIGURE 4*b* is a circuit diagram of the network shown in FIGURE 4*a*;

FIGURE 4*c* is a perspective view of another novel semiconductor network;

FIGURE 4*d* is an equivalent circuit diagram of the network shown in FIGURE 4*c*;

FIGURE 5*a* is a perspective view of still another novel semiconductor network embodying the principles of the present invention; and FIGURE 5*b* is an equivalent circuit diagram for the network of FIGURE 5*a*.

As noted, the principle object of this invention is to provide audio amplifier designs compatible with semiconductor integrated network technology, as taught in the aforementioned Kilby application. Two main problems are encountered in designing audio circuits to be incorporated in a single piece of semiconductor material. The input to a transistor amplifier stage inherently has a low impedance; therefore, a large coupling capacitor, one to ten microfarads, is required to match impedance. It is hard to design a solid-state integrated network that has such a large capacitance because of the large area that would be required. More reasonable capacitor values would be 0.001 to 0.010 microfarad. 0.001 microfarad is a convenient size capacitor to build into a solid-state integrated network circuit. Another problem encountered is the temperature dependence of the semiconductor material parameters and their effect upon device and circuit performance. This problem manifests itself by instability of the D.-C. bias voltages of the amplifier.

Figure 1:
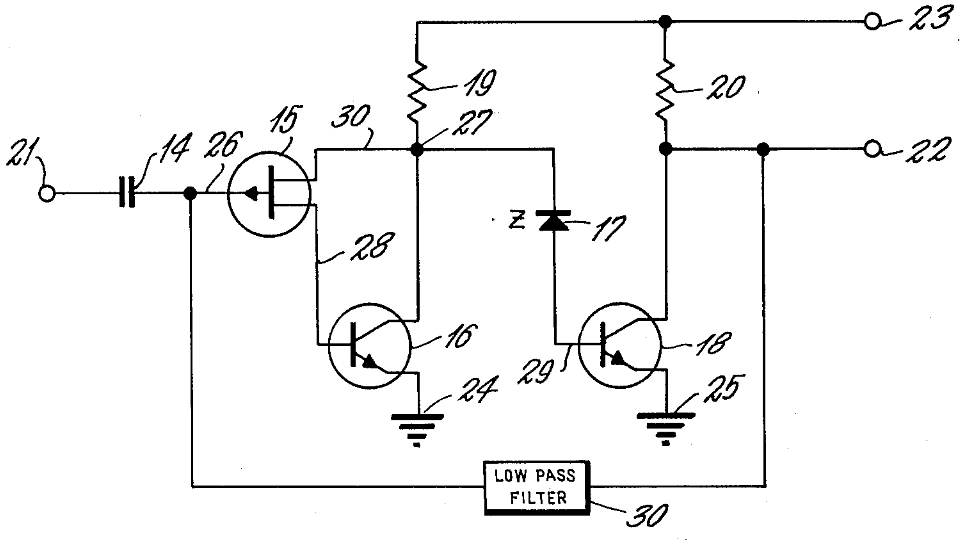
FIGURE 1 is a schematic of the novel audio amplifier of the present invention.

The problems dealt with in the preceding paragraph are overcome in the circuit shown in FIGURE 1. An input 21 is connected directly to coupling capacitor 14 which connects into the gate 26 of field-effect transistor 15. This gate circuit is inherently a high-impedance circuit and, therefore, a small coupling capacitor can be used. The channel of the field-effect transistor is defined between the source 30 and the drain 28 of the transistor. The drain 28 is connected to the base of an NPN transistor 16. The emitter of transistor 16 is connected to ground. The channel circuit of the field-effect transistor is inherently a low-impedance circuit and, therefore, matches to the low-input impedance of the base of the transistor 16. Load resistor 19 is connected to the collector of transistor 16 and to a supply voltage terminal 23. The source 30 of the field-effect transistor 15 is connected to terminal 27 between the load resistance 19 and transistor 16. The field-effect transistor 15, transistor 16, and resistor 19 form a first amplification stage which is similar in operation to a "cathode follower" network in that it has an amplification factor of less than unity, a high-input impedance, and low-output impedance. The second stage of amplification is also an NPN transistor 18 with its collector connected into a load resistance 20, which is connected to voltage supply terminal 23. The emitter of transistor 18 is grounded. Under normal operating conditions, the point 27 will be at a potential of approximately one-half that at terminal 23. It is desirable to drive the base of the second amplification stage at approximately six-tenths of a volt. Therefore, some means is required to drop the voltage from point 27 of the first stage to approximately 0.6 volt at the input of the second stage. A device that would regulate the voltage on the input of the second stage at this value and also be satisfactory from an impedance standpoint is a Zener diode. Thus, Zener diode 17 is used to couple point 27 of the first stage to the base of transistor 18, thereby maintaining the input voltage of the second stage at approximately 0.6 volt.

To overcome temperature instability of the D.-C. bias conditions, it is necessary to incorporate some means to stabilize the voltage on the gate of the field-effect transistor 15. This is accomplished by using negative feedback from the output 22 of the second stage to the gate 26 via a low-pass filter 30.

Figure 2:
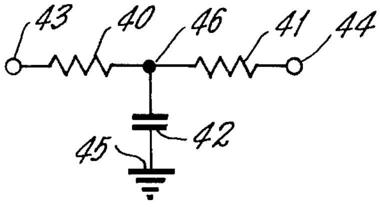
FIGURE 2 is a schematic diagram of a low-pass filter circuit.

An example of a typical low-pass filter is given in FIGURE 2. It consists of two resistors 40 and 41 in series, with a capacitor 42 connected between the two resistors and ground 45. Terminal 43 is connected to the gate of the field-effect transistor 26 and terminal 44 is connected to the output 22 of the second stage. Because of the high-input impedance to the gate of the field-effect transistor 15, reasonably large resistors are necessary in the low-pass filter. These resistors should be in the order of $10^7$ ohms. Another reason for using high values of resistance for resistor 40 and resistor 41 is to allow capacitor 42 to be of relatively low capacitance, but still achieve good attenuation of the A.-C. signal in the feedback loop. This low-pass filter then allows the A.-C. to be filtered out to ground 45, blocks the D.-C. from passing to ground 45, and allows a negative feedback D.-C. voltage to be impressed on the gate 26 of the field-effect transistor 15 to stabilize D.-C. bias conditions.

Repeating, the resistors of the low-pass filters must be reasonably large, in the order of $10^7$ ohms. First, this is to match the impedance of the gate circuit of the field-effect transistor 15 and, secondly, to allow a small capacitor 42 to be used between terminal 46 and ground 45.

Figure 3:
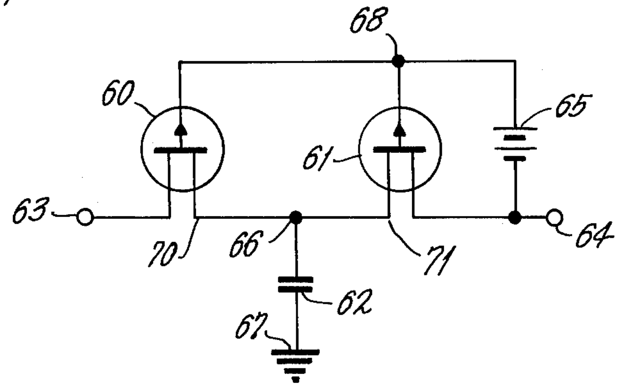
FIGURE 3 is a schematic diagram of a novel low-pass filter circuit.

It must be noted that large resistors cannot easily be incorporated in a solid-state integrated network circuit and retain the concept of smallness. Therefore, a low-pass filter using field-effect transistors is used in the place of a filter using resistors. FIGURE 3 shows two field-effect transistors 60 and 61 connected in series, and in combination with capacitor 62 to form a low-pass filter. The characteristics of the channel of the field-effect transistors is such that with a reasonably large gate voltage, the field-effect device is "pinched off" and the resistance of the channel circuit becomes very high, requiring a large voltage across the channel circuit of the field-effect transistor in order to produce an appreciable current. With high enough voltage on the gates of the field-effect transistors, the resistance of the channel circuits can be made in the order of $10^7$ ohms. In FIGURE 3, the source of one transistor 60 and the drain of the other transistor 61 are connected to a common terminal 66. The gates of the transistors are connected together by lead 68 and to a battery 65. These field-effect transistors are in effect used as voltage variable resistors. They lend themselves to integrated network circuitry, as they can be incorporated as high resistances, and allow the use of a small capacitor 62 which may be in the order of 0.001 microfarad. The battery 65 can be replaced by another potential source. For example, lead 68 can be connected to a tap on the load resistance 20 to provide a high enough gate voltage to make the channel portions of the field-effect transistors of sufficiently high resistance to be usable in a low-pass filter.

A solid semiconductor network, embodying the principles of this invention, is shown in FIGURE 4*a*. Starting with an N-type single-crystal silicon substrate 100 (7 to 9 ohm-cm. and 3 to 5 mils thick), it is first optically polished on one side. After cleaning, the polished wafer is diffused with gallium from a surface concentration of about $3 \times 10^{16}$ atoms per cc. to a depth of approximately 0.1 mil to form a P-type channel 102. The wafer is then given a second diffusion of phosphorus from a surface concentration of about $10^{20}$ atoms per cc. to a depth of from about 0.05 to 0.08 mil. By use of oxide masking, this diffusion is restricted to the area identified by the reference numeral 104. This N-type diffusion produces the gate region of the device. Aluminum can then be evaporated and alloyed to the device as gate, source, and drain contacts. It will be appreciated that the unwanted diffused layers on the back and side of substrate can be removed by lapping. In FIGURE 4*a*, ohmic contacts 106 and 108 constitute the source and gate contacts to the field-effect device. The drain contact is not shown for reasons that will appear hereinafter. With the device as described, transconductance of the order of 50 $\mu$mhos-per-mil of gate width has been achieved. Also, typical units have been found to have a pinch-off voltage of about 3 volts, and a gate-to-channel breakdown voltage of about 20 volts.

In the foregoing description, silicon is noted as the semiconductor material. It should be understood that other semiconductor materials may be employed in the present invention in place of silicon. Thus, such materials as germanium, gallium arsenide, indium antimonide, and other semiconductor materials can be employed. The use of silicon, however, is believed to produce superior results, as it lends itself more readily to the fabricating techniques required. This material also has several other advantages that will become more evident as the description of the invention proceeds.

The diffusion operations described above are carried out in a conventional way using suitable temperatures and times as is known in the art. Although the specific illustration given above demonstrating the diffusion steps affords a good understanding of these processes, it will be appreciated that the P-type layer 102 can be produced using any impurity material that will function as required. The diffusion processes are conducted under solid-state conditions, for example, at an elevated temperature of approximately 1200° C., using an amount of impurity to produce the desired surface concentration. The diffusion time is selected to produce penetration of the impurity atoms and the establishment of a PN diffused junction at the desired depth. Masking is utilized, as is known in the art, during the second diffusion step conducted to introduce the N-type impurity into the P-type diffused layer 102 to define the N-type region 104. The depth of penetration of the N-type impurity atoms to establish a PN junction is controlled to leave a P-type conductivity channel beneath the diffused N-type conductivity region 104 approximately 0.02 mil in thickness. The width of the region 104 is approximately 1 mil. It is, therefore, evident that the channel of the field-effect transistor produced by the technique above is approximately 1 mil in length and approximately 0.02 mil in thickness. In the foregoing, the reference to specific materials, times, and temperatures are merely illustrative and not limitative. In fact, the conductivity types of all regions can be reversed, as is known in the art, and it is equally possible to start with a P-type wafer.

FIGURE 4*a* also shows a unipolar field-effect transistor, a bipolar transistor, and a load resistor combined on a single wafer to produce a device having high-input impedance. This combination constitutes a unique and novel network. The channel 102 of the unipolar transistor is extended to become base region 112 of the bipolar transistor.

The main body of the wafer 100 directly beneath the region 112 constitutes the collector region of the bipolar transistor. There is diffused into the upper surface of the region 112 a suitable N-type impurity to establish a region 120 of N-type conductivity to function as the emitter region of the bipolar transistor. A suitable ohmic contact 122 is made to the surface of the emitter region 120. A lead 124 connects the contact 122 with a tab 126 functioning as the B minus connection for the device. The lead 124 is joined to a contact 128 on the tab 126 by any conventional soldering technique, as is well known in the art.

A signal voltage applied via input tab 114, lead 116, and contact 110 to the gate of the unipolar transistor modulates the base current of the unipolar transistor. The reason why the drain contact has been omitted is now evident. The drain end of the unipolar device is contiguous with the base region 112.

The over-all transconductance of the combined device is equal to the product of the $g_m$ of the unipolar region and the $h_{fe}$ of the bipolar region. This circuit is somewhat similar in operation to a "cathode follower." The bulk resistance of the N-type semiconductor material in the region 130 contiguous to collector region 121 is used as a load resistor. Tab 132 attached to the opposite end of region 130 serves as a load voltage supply connection (B+). Tab 134, connected to the collector region 121, would ordinarily be used as an output for this circuit arrangement. Lead 136 connects tab 134 to source contact 106. This circuit has the valuable properties of low distortion, high-input impedance and low-output impedance.

A method of coupling to the input of a bipolar amplifier stage from the collector of a preceding stage is also shown in FIGURE 4*a*. Here, a Zener diode 140 having the desired breakdown voltage serves as the coupling element. Diode 140 is formed by diffusing an N-type impurity onto P-type diffused base layer 142 of the second bipolar transistor. Once the diode breakdown voltage has been exceeded, it has low incremental resistance and, thus, a high-coupling efficiency. Emitter 144 is also formed by diffusing an N-type impurity onto P-type diffused base layer 142. Region 146 of wafer 100 serves as the collector. The bulk resistance of region 148 contiguous to collector region 146 serves as a load resistor for the bipolar transistor. Tab 150, attached to collector region 146, serves as an output for the over-all combination of elements.

The amplifier elements described above are combined on a single crystal of silicon as a two-stage amplifier, as shown in FIGURE 4*a*. To complete the circuit interconnections, lead 152 connects tab 126 with emitter region 144, and lead 154 connects tab 134 with Zener diode 140. Due to 100% negative feedback, the voltage amplification of the first stage (left half of crystal) will be approximately unity and its output impedance will be low. The voltage amplification of the second stage (right half of crystal) will be equal to the product of the resistance of region 148 and the transconductance $g_m$ of the bipolar transistor (142, 144, 146). Since this stage is being driven from a low-impedance source, its voltage amplification will be fairly independent of the $h_{fe}$ of the bipolar transistor (142, 144, 146). Also, it can be shown that, if the product of the resistance of region 148 collector current ($I_c$) of the bipolar transistor (142, 144, 146) can be held constant, the amplification will not be sensitive to moderate changes in the value of resistance of region 148. If the value of resistance of region 130 is several times the input impedance of the bipolar transistor (142, 144, 146), for example, 10K ohms, then moderate changes in its value will have little effect on the amplifier performance. Thus, the tolerance on the values of the resistance of regions 148 and 130 need not be tight.

However, with the circuit as shown, the output transistor (142, 144, 146) will likely not be biased in its active region. A few tenths of a volt variation in the voltage at the collector 121 of the first bipolar transistor will drive the other bipolar transistor either into saturation or cutoff. Even if the second bipolar transistor is biased in its active region, the voltage amplification will be approximately a linear function of the resistance of region 148 and the collector current of the second bipolar transistor. These problems can be greatly reduced by applying a large amount of D.-C. negative feedback to the amplifier, thus maintaining the bias voltage of the output stage substantially fairly constant. Since the input impedance of the amplifier is high, the resistance of the feedback loop can be large without appreciably reducing the D.-C. gain of the feedback loop. A low-pass filter, as shown in FIGURES 2 and 3, can be used. The low-pass filter of FIGURE 3 is preferred if the entire circuit is to be integrated into a single crystal of silicon. The equivalent circuit of the semiconductor network of FIGURE 4*a* is shown in FIGURE 4*b*.

The amplifier shown in FIGURE 4*a* has been fabricated with a low-pass R-C feedback network, consisting of two 10 megohm resistors and a 0.001-$\mu$f. capacitor, and a 0.001-$\mu$f. input coupling capacitor added. Thus connected, the circuit had a mid-frequency voltage amplification of about 40 db, a bandpass of about 100 to 100,000 c.p.s.

The first stage of the arrangement shown in FIGURE 4*a*, as described, consists of a field-effect transistor in combination with a bipolar transistor having a load resistor in the collector circuit. As shown in FIGURE 4*c*, this same general arrangement can be utilized, but in place of connecting the load resistor in the collector circuit, it can be connected in the emitter circuit. In FIGURE 4*c*, a semiconductor wafer 400, for example of N-type conductivity, is provided, in which the upper surface thereof contains a diffused layer 402 of P-type conductivity. This can be produced in the same manner as was described with reference to FIGURE 4*a*. Also contained in the diffused layer are second and third diffused regions 404 and 406 which are both of N-type conductivity in order to establish the gate of the field-effect transistor and the emitter region of the bipolar transistor. Since the load resistor is to be in the emitter circuit as contrasted with being in the collector circuit, the diffused P-type layer 402 over the remaining portion of the wafer is left intact. A slot 408 is cut adjacent to the bipolar transistor in order to electrically insulate by mechanical shaping the remainder of the P-type diffused layer 402 from that portion which actively is employed in the field-effect transistor and the bipolar transistor. Since the load resistor constituted by the remainder of the P-type region is to be in the emitter circuit, a suitable lead 410 connects the emitter region 406 of the bipolar transistor with one end of the remaining P-type diffused layer identified by reference numeral 412. The opposite end of the remaining P-type diffused layer 412 is connected via a suitable lead 414 to a ground terminal 416. The source end 418 of the unipolar field-effect transistor has connected thereto by an ohmic contact 420, a lead 422 which terminates at a terminal 424 to be connected with a suitable voltage supply. The input to the device is via the gate region 404 of the unipolar transistor by means of a lead 426 attached thereto. A suitable input terminal 428 is provided attached to the opposite end of the lead 426. A suitable output terminal 430 is connected to the lead 410. A suitable contact 432 is made to the collector region of the bipolar transistor, and a lead 434 is attached thereto, for making connection to a voltage supply source. The equivalent circuit for the semiconductor network of FIGURE 4*c* is shown in FIGURE 4*d*.

A semiconductor network combining the features of FIGURE 4*a* and FIGURE 3, as previously described, is illustrated in FIGURES 5*a* and 5*b*. As shown, an input terminal 160 connects with a coupling capacitor 162, which is connected to the gate region of a field-effect coupling transistor generally designated by the reference numeral 164. The construction of this portion of the device is the same as described in conjunction with FIGURE 4*a* of the said copending Kilby and Evans application. The channel of the field-effect transistor 164 connects with the base region of a bipolar transistor, generally designated by the reference numeral 166. This arrangement is again the same as illustrated in FIGURE 4*a* of the said copending Kilby and Evans application. The load resistance for the bipolar transistor 166 is constituted by the bulk resistance of the region of the semiconductor body 168 contiguous with the collector region of the bipolar transistor 166. A suitable lead 170 interconnects the source end of the field-effect transistor 164 with the collector region of the bipolar transistor 166. A suitable voltage supply is attached to the end of the region 168 remote from the bipolar transistor 166. This attachment is indicated generally by the reference numeral 172. At the opposite end of the semiconductor body, there is located a second stage consisting of a bipolar transistor, designated generally by the reference numeral 174. A Zener diode 176 connects with the base region of the transistor 174. A lead 178 connects the other side of the diode 176 with the collector of the transistor 166. Thus far, the description of the semiconductor network is the same as that for FIGURE 4*a* of the said Kilby and Evans copending application. The method of manufacturing this semiconductor network is the same as previously given, namely, starting with an N-type wafer of silicon into which is diffused a suitable P-type impurity to produce the base regions of the bipolar transistors and the channel of the field-effect transistor. Thereafter, the emitter regions of the bipolar transistors, as well as the gate region of the field-effect transistor, are produced by a subsequent diffusion of an N-type impurity. It will be appreciated that in some cases it will be possible to utilize an alloying technique to establish the emitter regions of the bipolar transistors in the P-diffused layer. Conceivably, an alloy technique can be utilized to establish the gate region for the field-effect transistors. Alloy techniques, however, are not the equivalent of diffusion processes for the reason that they are more difficult to control, and less susceptible of reproducible results. The region between the collector of the transistor 174 and the attachment or contact 172 is generally designated by the numeral 180, and functions as the load resistor for the bipolar transistor 174. In this regard, the bulk resistance of the semiconductor body furnishes the load resistance. An output terminal 182 is attached to the collector region of the transistor 174 by means of a lead 184.

Formed on the semiconductor body above the region 180 are two field-effect transistors joined together and in combination with a capacitor 186 for the purpose of providing a low-pass filter between the output of the transistor 174 and the input to the gate of the field-effect transistor 164. The two field-effect transistors are formed by a P-diffused layer 188 into which has been further diffused two N-type regions 190. Each N-type region defines beneath it the channel for its respective field-effect transistor. The two N-type regions 190 constitute the gates for the field-effect devices, and are connected together by means of a lead 191 and to an intermediate portion of the region 180 by means of lead 192. To stabilize the bias on the gates 190, a Zener diode is formed on the region 180 intermediate the output 182 and supply terminal 172 and connected by lead 199 to the output 182. Lead 193 connects the output lead 184 with one end of the field-effect devices at contact 194. The other end of the field-effect devices at contact 195 is connected by means of lead 196 back to the gate of field-effect transistor 164. The region intermediate the two N-type diffused regions 190 is connected by means of a contact 197 and lead 198 to capacitor 186, the other side of which is grounded. The emitter region of transistor 174 is connected to ground. The emitter region of transistor 166 is also connected to ground. By connected to ground is meant that a suitable terminal or tab is provided to which the emitter regions are connected either by leads or other means for the purpose of grounding these areas. The equivalent circuit for the semiconductor network shown in FIGURE 5*a* is illustrated in FIGURE 5*b*.

It will be appreciated that the problem of D.-C. bias stability is overcome to a large extent in this semiconductor network by means of the large amount of D.-C. negative feedback that is furnished from the output lead 184 to the gate of the field-effect transistor 164 via the low-pass filter constituted by the field-effect devices located above the region 180 and the capacitor 186. In this connection, the field-effect devices function as voltage-variable resistors and provide resistances in the order of megohms for attenuation, whereas the capacitor 186 functions as an A.-C. shunt or bypass. Thus, the D.-C. is fed back without difficulty, whereas the A.-C. component of the output signal is shunted out of the feedback loop.

In the semiconductor network of FIGURE 5*a*, capacitors 162 and 186 have not been included. It is possible to fabricate these capacitors from the same wafer used for the network of FIGURE 5*a* simply of widening the wafer and using the additional space for the fabrication of capacitors 162 and 186. These capacitors can be made either as PN junction types or as oxide types as shown in the aforementioned Kilby application. By this means, the capacitors can be fabricated at the same time as the semiconductor network. After completion, the wafer can be etched through or otherwise divided to separate the network and the capacitors. The three semiconductor parts can then be mounted on a ceramic wafer using tabs and appropriate interconnections.

Although the present invention has been shown and described in terms of preferred embodiments, nevertheless, changes and modifications will occur to those skilled in the art which do not depart from the teachings of this invention. Such changes and modifications are deemed to fall within the purview of this invention.

What is claimed is:

1. A semiconductor integrated circuit device comprising a wafer of monocrystalline semiconductor material, a plurality of circuit elements defined in the wafer adjacent one major face thereof, said circuit elements including a unipolar field-effect device having a thin channel region and a gate region provided by contiguous layers of semiconductor material of opposite conductivity-types, the gate region separating the channel region into a source and a drain which are connected together within the wafer only by a thin portion of the channel region underlying the gate region, voltage reference means defined in the wafer adjacent said one major face by contiguous regions of opposite conductivity-types, and means connecting the voltage reference means across the source and gate region of the field-effect device so that the channel region of the field-effect device will provide a large resistance.

2. In a semiconductor integrated circuit device which includes a semiconductor wafer having a plurality of circuit elements adjacent one major face thereof: a unipolar field-effect device defined in the wafer adjacent said one major face and including a thin diffused channel region and a shallow gate region provided by contiguous regions of semiconductor material of opposite conductivity-types, the gate region overlying an intermediate portion of the channel region and separating the channel region into a source and a drain which are connected together only by said intermediate portion, the source and drain being connected in a closed series circuit with at least one of said plurality of circuit elements, means for producing a reference voltage including contiguous regions of opposite conductivity-types defined in the wafer adjacent said one major face, the reference voltage exceeding the pinch-off voltage of said unipolar field-effect device, and means connecting the reference voltage across the source and gate region of the field-effect device so that the field-effect device provides a large resistance in said closed series circuit.

3. A low-pass filter circuit device comprising a wafer of single crystal semiconductor material, a pair of unipolar field-effect devices defined in the wafer adjacent one major face thereof, each of the field-effect devices having a channel region defined by a thin surface portion of the wafer and a gate region defined by a shallow surface portion of the wafer overlying the channel region, the gate region of each field-effect device separating the channel region into a source and a drain which are connected together only by an intermediate portion of the channel region underlying the gate region, the drain of one field-effect device being electrically connected to the source of the other field-effect device, the gate regions of the pair of field-effect devices being electrically connected to one another, a capacitor provided adjacent said one major face of the wafer, one plate of the capacitor being connected to the drain of said one field-effect device, a semiconductor diode defined in the wafer adjacent said one major face by contiguous regions of opposite conductivity-types, the diode having a reverse breakdown voltage greater than the pinch-off voltage of the field-effect device, means for applying a reverse voltage across the diode, means connecting the diode across the source and gate region of said one field-effect device, the source of said one field-effect device and the other plate of said capacitor providing input terminals to the low-pass filter and the drain of the other field-effect device and the other plate of the capacitor providing output terminals.

References Cited by the Examiner

UNITED STATES PATENTS

| | | | |
|---|---|---|---|
| 2,544,211 | 3/1951 | Barton. | |
| 2,744,970 | 5/1956 | Shockley | 330—39 |
| 2,754,431 | 7/1956 | Johnson | 323—94 |
| 2,805,397 | 9/1957 | Ross | 330—38 X |
| 2,900,531 | 8/1959 | Wallmark | 307—88.5 |
| 2,984,752 | 5/1961 | Giacoletto | 307—88.5 |
| 3,022,472 | 2/1962 | Tanenbaum et al. | 307—88.5 |

OTHER REFERENCES

Dacey et al.: Proceedings of the I.R.E., vol. 41, Issue 8, pages 970–979, published August 1953.

HERMAN KARL SAALBACH, *Primary Examiner.*

ELI LIEBERMAN, E. JAMES SAX, P. L. GENSLER, W. K. TAYLOR, C. H. SCHWARTZ, *Examiners.*